United States Patent [19]

Winter

[11] 4,020,487
[45] Apr. 26, 1977

[54] ANALOG-TO-DIGITAL CONVERTER EMPLOYING COMMON MODE REJECTION CIRCUIT

[75] Inventor: Arthur J. Winter, Encino, Calif.
[73] Assignee: Fairchild Camera and Instrument Corporation, Mountain View, Calif.
[22] Filed: Mar. 30, 1976
[21] Appl. No.: 671,844

Related U.S. Application Data

[63] Continuation-in-part of Ser. No. 627,718, Oct. 31, 1975, abandoned.

[52] U.S. Cl. .................. 340/347 NT; 340/347 M; 340/347 CC; 324/99 D
[51] Int. Cl.² .................................. H03K 13/02
[58] Field of Search ............ 340/347 AD, 347 NT, 340/347 CC, 347 M; 324/99 D; 328/181, 183

[56] References Cited

UNITED STATES PATENTS 3,697,980  10/1972  Boinodiris et al. ......... 340/347 DA
3,918,044  11/1975  Alpatoff et al. ............ 340/347 AD

OTHER PUBLICATIONS

Barnes, "Improve Single-Slope A/D Accuracy," Electronic Design, Jan. 1973, pp. 58-62.
Peterson, Two-Amplifier System for Rejecting Common Mode Voltages, IBM Technical Disclosure Bulletin, vol. 6, No. 7, Dec. 1963, p. 85.
Analog Devices, Inc., Analog-Digital Conversion Handbook, June 1972, p p. II-166 to II-168.

Primary Examiner—Thomas J. Sloyan
Attorney, Agent, or Firm—Alan H. MacPherson; Henry K. Woodward; Norman E. Reitz

[57] ABSTRACT

An analog-to-digital converter of the single slope detection type comprising a first input terminal for receiving a first input signal formed by the superposition of a common mode noise voltage on a first DC voltage, a second input terminal for receiving a second input signal formed by the superposition of the common mode noise voltage on a second DC voltage, a ramp generator responsive to the second input signal and operative to separate the common mode noise voltage from the second input signal and to develop a ramp reference signal that is modulated by the common mode noise voltage, a first comparator for comparing the signals at the first terminal and at the output of the ramp generator and for developing a first output signal which changes state when the level of the modulated ramp reference signal exceeds the level of the first input signal, a second comparator for comparing the signals at the second terminal and at the output of the ramp generator and for developing a second output signal which changes state when the level of the modulated ramp reference signal exceeds the level of the second input signal, and a logic circuit responsive to the first and second output signals and operative to produce a pulse having a duration that corresponds to the time difference between the changes of state of the first and second output signals and operative to produce a pulse having a duration that corresponds to the time difference between the changes of state of the first and second output signals, such duration being indicative of the voltage difference between the first input signal and the second input signal.

10 Claims, 6 Drawing Figures

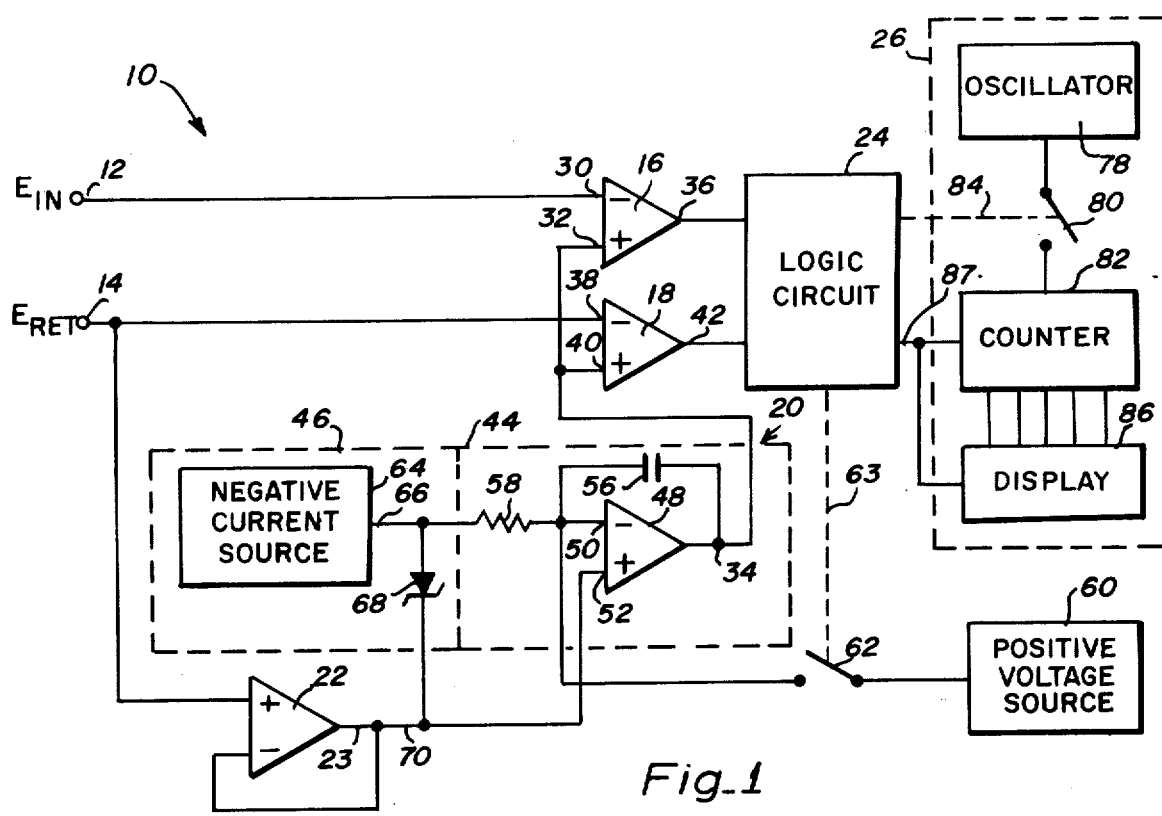
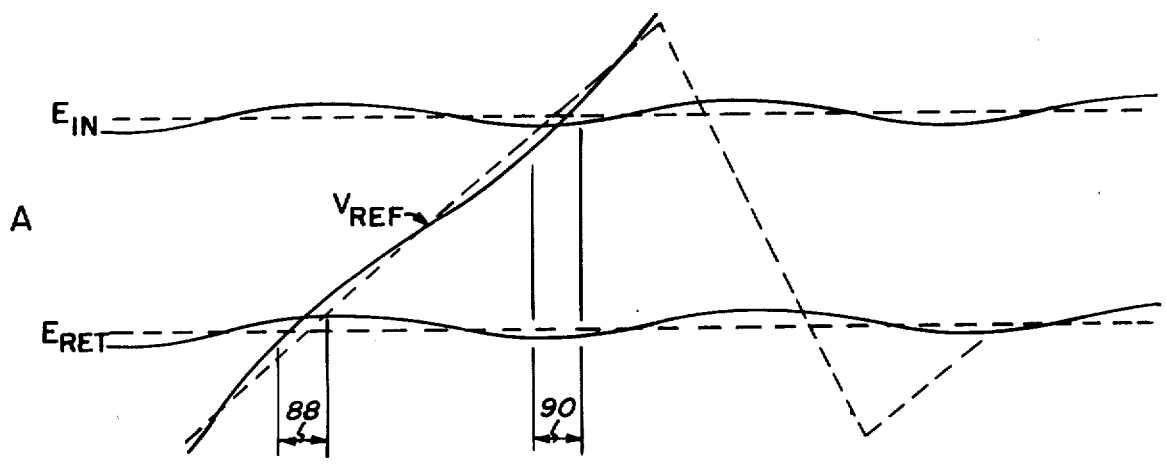
Fig_1
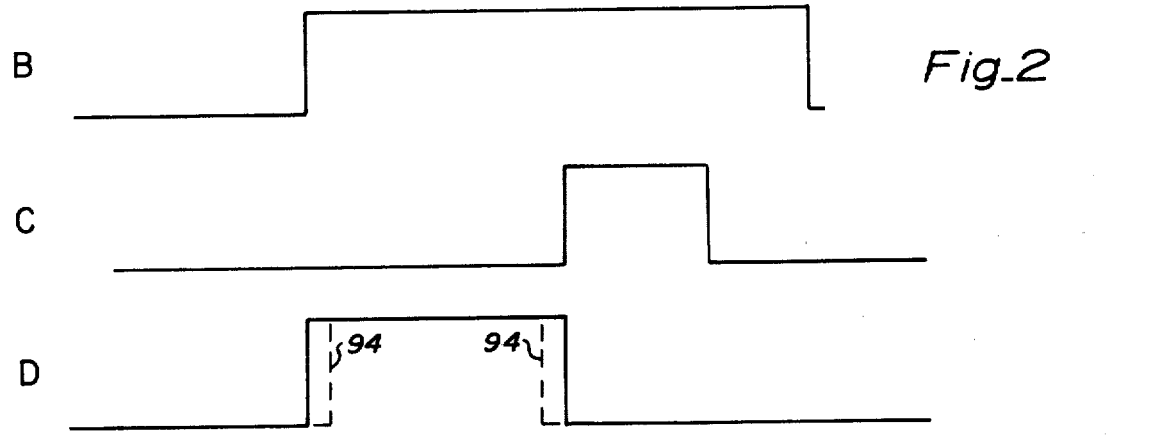
Fig_2

Fig_5

ANALOG-TO-DIGITAL CONVERTER EMPLOYING COMMON MODE REJECTION CIRCUIT

Cross-Reference to Related Application

This application is a continuation-in-part of application Ser. No. 627,718, filed Oct. 31, 1975, now abandoned.

BACKGROUND OF THE INVENTION

1. Field of the Invention

The present invention relates to generally to analog-to-digital converters, and more particularly to analog-to-digital converters of the single slope detection type which employ common mode rejection circuits.

2. Description of the Prior Art

Integrating analog-to-digital converters, or digital voltmeters, include dual slope and single slope modes of conversion. Dual slope converters typically provide a digital output which is accurately representative of the ratio of the integrals of first and second input signals applied to an integrating means such as a capacitively coupled DC amplifier. The first input signal, representing an analog signal to be measured, generates a first ramp voltage when applied to the amplifier, and the second input signal, representing a reference voltage, generates a second ramp voltage of opposite slope. Time for each of the two ramp voltage voltages to traverse between two voltage levels defines the ratio of the two input signals, and counter means records the count of constant frequency pulses during the time period to provide a measurement of the first input signal via a vis the reference signal. Since two continuous slopes are provided by the two time integrations, such digital voltmeters are referred to as "dual-slope." Dual-slope digital voltage meters are exemplified by U.S. Pat. Nos. 3,051,939; 3,316,547; and 3,713,136.

Analog-to-digital converters or digital voltmeters, of the single slope detection type provide a signal in digital form which is representative of the voltage difference between two input signals in analog form. Typically, such digital voltmeters include a precision voltage source for supplying a ramp reference voltage and a pair of comparators which change state at a time when the level of the ramp voltage applied to a first of their inputs crosses the level of an input signal such as a DC voltage applied to a second input. A digital logic circuit converts the time difference between the change of states of the comparators into a pulse having a duration indicative of the difference in the DC voltages and a display provides a visual indication of the digital signal.

The duration of the pulse developed by these devices is representative of the difference in the input signals provided that the input signals do not include noise voltage, especially such noise voltage having frequencies characterized by cyclic periods of the same order as, or less than, the time interval between output pulses. A common mode noise voltage is that voltage due to noise which is common to the two input terminals relative to a reference level, such as earth ground. A normal mode noise voltage is that voltage due to noise which appears between the two input terminals. The type of noise voltage generally present at the input terminals of voltmeters is due to power-line hum, such as 50 Hertz, 60 Hertz and 400 Hertz hum. Since such noise voltage is characterized by periods of time which are usually less than the time interval between the output pulses, it causes a variation between the actual time that the input signal crosses the ramping reference voltage and the true time, and thus causes a departure in the pulse width from the true difference in the input voltages.

In prior-art single-slope digital voltmeters, attempts have been made to diminish the magnitude of common mode noise voltage by introducing filter circuits ahead of the comparators. However, in order to achieve good common mode noise voltage suppression, the filter circuits have required matched components. This, of course, adds to the overall cost of the device. Another dis-advantage of this approach is that the filters are only successful in rejecting a limited amount of the common mode noise voltage. Thus, heretofore dual-slope digital voltmeters have offered substantially more accuracy in measurement than single-slope digital voltmeters.

SUMMARY OF THE PRESENT INVENTON

It is therefore an object of the present invention to provide a method and means for cancelling out the effect of common mode noise voltages on an analog-to-digital converter of the single-slope detection type.

Another object of the present invention is to provide a novel means for causing the reference signal applied to the comparators in an analog-to-digital converter of the single-slope detection type to vary in the same manner as common mode noise voltages applied to the input terminals of the comparator.

Still another object of the present is to provide a digital voltmeter of the single-slope detection type which has a low susceptibility to common mode noise voltage.

Briefly, the preferred embodiments of the present invention include a first input terminal for receiving a first input signal formed by the superposition of a common mode noise voltage on a first DC voltage, a second input terminal for receiving a second input signal formed by the superposition of the common mode noise voltage on a second DC voltage, a ramp generator responsive to the second input signal and operative to separate the common mode noise voltage from the second input signal and to develop a ramp reference signal that is modulated by the common mode noise voltage, a first comparator having a first input connected to the first terminal for receiving the first input signal, a second input for receiving the modulated ramp reference signal, and a first output, the first comparator being responsive to the first input signal and the modulated ramp reference signal and operative to produce a first output signal on the first output which changes state when the voltage level of the modulated ramp reference signal exceeds the level of the first input signal, a second comparator having a third input connected to the second terminal for receiving the second input signal, a fourth input for receiving the modulated ramp reference signal, and a second output, the second comparator being responsive to the second input signal and the modulated ramp reference signal and operative to produce a second output signal on the second output which changes state when the level of the modulated ramp reference signal exceeds the level of the second input signal, and a logic circuit coupled to the first and second ouputs, the logic circuit being responsive to the first and second output signals and operative to produce a pulse having a duration that corresponds to the time difference between the changes of state of the first and second output signals, such duration being indicative of the voltage difference between the first input signal and the second input signal.

These and other objects and advantages of the present invention will no doubt become apparent following a reading of the following detailed description of the preferred embodiments which are illustrated in the several figures of the drawing.

IN THE DRAWINGS

FIG. 1 is a block diagram schematically illustrating a preferred embodiment of an analog-to-digital converter of the single-slope detection type in accordance with the present invention;

FIG. 2 is a graphical presentation of waveforms at various points of the circuit of FIG. 1;

DETAILED DESCRIPTION OF THE PREFERRED EMBODIMENTS

Figure 3:
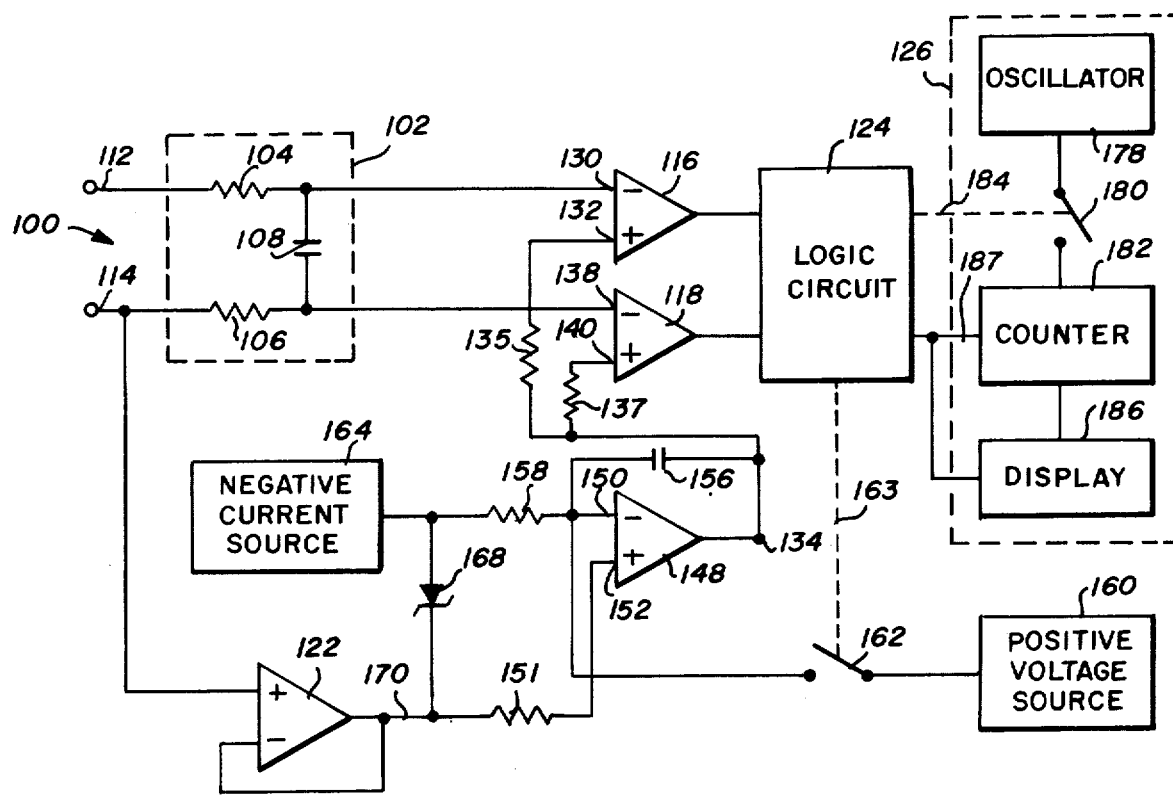
FIGS. 3-5 are block diagrams schematically illustrating alternative embodiments of an analog-to-digital converter in accordance with the present invention.

Referring now to FIG. 1 of the drawing, there is shown a block diagram of a preferred embodiment of an analog-to-digital converter 10 in accordance with the present invention. As illustrated, the converter 10 is a digital voltmeter of the single slope detection type and comprises input terminals 12 and 14, comparators 16 and 18, a ramp generator 20, an isolation amplifier 22 coupled between the input terminal 14 and the ramp generator 20, digital logic circuit 24 and an output circuit 26.

The comparator 16 is a high gain differential amplifier and includes an inverting input 30 connected to the terminal 12, a noninverting input 32 connected to the output 34 of the ramp generator 20, and an output 36. As will be explained in more detail below, generator 20 develops a particular type of reference signal for input to comparators 16 and 18. The comparator 16 develops a low output when the magnitude of the input signal applied to input 30 is greater than the reference potential applied to its input 32, and changes state or generates an output having a high value on output 36 when the reference signal is greater than the input signal. Similarly, the comparator 18 is a high gain differential amplifier and includes an inverting input 38 connected to the terminal 14, a noninverting input 40 connected to the output 34, and an output 42. The comparator 18 develops a low output when the magnitude of the input signal applied to input 38 is greater than the reference potential applied to its input 40 and generates an output having a high value on output 42 when the reference signal is greater than the input signal.

The ramp generator 20 includes an integrating circuit 44 and a source of DC potential 46. The integrating circuit 44 comprises an operational amplifier 48 having an inverting input 50, a noninverting input 52 and the output 34. A capacitor 56 is connected in shunt with the amplifier 48 between the output 34 and the input 50 and a resistor 58 is serially connected between the source 46 and the input 50 so as to form the amplifier 48 into an integrator configuration. The integrating circuit 44 provides an output signal on its output 34 which is proportional to the integral of the difference in input signals applied between the input of the resistor 58 and input 52. Since the input 52 is not connected to ground but is allowed to float, the output signal is modulated by the instantaneous signal applied to the input 52. The integrating circuit is conventional, hence a more detailed explanation of its operation is not required.

In the preferred embodiment, in response to a constant magnitude negative potential difference applied between the input of the resistor 58 and the input 52, the output signal is a ramp voltage having a constant positive slope. The slope is proportional to the inverse of the product of the capacitance of capacitor 56 and the resistance of resistor 58. However, when the potential on the input 52 is caused to vary such as by the application of common mode noise thereto, the ramp voltage has superimposed thereon a corresponding voltage change that is in time coincidence with the noise. Accordingly, the composite ramp voltage thus formed by the modulation of the ramp by the common mode noise is referred to as the modulated ramp reference signal.

In order to reset the integrating circuit 44 to an initial condition after the ramp has reached a predetermined maximum voltage level, a reset circuit is coupled to the input 50. The reset circuit includes a source of positive DC voltage 60 such as a battery or the like, having an output connected to a terminal of an electronic switch 62, the opposite terminal of the switch 62 being connected to the input 50. The switch 62 is of a suitable type which may be used to open or close the reset circuit under the control of a signal from the logic circuit 24 as indicated by the dashed lines 63. The logic circuit 24 serves to provide a signal that closes the switch 62 at a time when the ramp reaches a predetermined maximum voltage level, thereby connecting the source 60 to the input 50. This of course causes the voltage level on input 50 to rise, and the voltage at output 34 to decrease. At a time when the ramp is reset to its initial level, the logic circuit 24 provides a signal that causes the switch 62 to open. As soon as the switch 62 is opened, the application of a constant potential difference between the input of resistor 58 and the input 52 causes the integrating circuit 44 to produce the ramp on its output 34.

The DC source 46 includes a current source 64 having an output 66 and serves to supply a negative current having a generally constant amplitude. Such current sources 64 are well known in the art, and accordingly its structure and method of operation are not described herein. A standard Zener diode 68 is connected between the output 66 and a line 70 connected to the cathode of the diode and to the input 52. The Zener diode 68 has a known reverse-breakdown voltage that causes the diode to break down when its anode voltage goes negative by a predetermined amount relative to the voltage appearing on the line 70. The Zener diode 68 serves to clamp the input 50 at a predetermined voltage difference relative to the voltage appearing at input 52 while permitting the voltage at its cathode to rise in accordance with voltage changes present on line 70. Consequently, the voltage at its anode, and hence the voltage at the input 50 varies in a like manner as the voltage present on line 70. It should be recognized that in alternative embodiment the zener diode may be replaced by other voltage-regulating devices.

The amplifier 22 is an operational amplifier connected to have a unity gain characteristic. The noninverting terminal of the amplifier 22 is connected to the input terminal 14. Its output 23 is connected to line 70 and also to its inverting input terminal. The amplifier 22 has a high input impedance and serves to conduct the input signal present at the input terminal 14 to the line 70 while isolating the output stage of the devices (now shown) connected to the input terminal 14 from impedance variations of the integrating circuit 44. Typically, such devices may be power supplies, transducers, etc.

The digital logic circuit 24 is connected to the outputs 36 and 42 and senses the difference between time occurrences of the change of state of the comparators 16 and 18 and produces an output pulse having a time duration which corresponds to the difference. As will be described later, the time duration of the pulse is indicative of the difference of DC voltages applied to the input terminal 12 and 14. The digital logic circuit 24 also serves to provide signals to control the operation of the switches 62 and 80 and to provide a reset signal on line 87. The circuit 24 provides a logic NAND function and is conventional and well known in the art, as illustrated in the detailed schematic of one embodiment in FIG. 6.

The output circuit 26 includes an oscillator 78 connected through an electronic switch 80 to a counter 82. The oscillator 78 may comprise a crystal-controlled oscillator or free running multivibrator with a capability of generating a train of pulses which is fed to the counter 82 when the switch 80 is closed. The switch 80 is coupled to the logic circuitry 24 as indicated by the dashed line 84 and is closed at a time corresponding to the rise of the leading edge of the pulse and opened at a time corresponding to the occurrence of the trailing edge of the pulse. The counter 82 is typically of the digital type which includes a multiplicity of stages and serves to count the pulses applied by the oscillator 78. Alternatively, it may be a binary counter, a binary coded decimal counter, or a counter in any base number system that the designer may choose. A display 86 is coupled to each of the stages and provides a visual indication, such as a decimal number of the number of counts registered by the counter 82. The line 87 is connected to the counter 82 and the display 86 and serves to conduct a reset signal to those elements at the termination of each cycle of operation.

Operation of the converter 10 is best understood with reference to FIG. 2 which illustrates waveforms at various points in the converter. As shown in FIG. 2A, the input signal present at input terminal 12 is designated as $E_{in}$. $E_{in}$ is the resultant voltage formed by the combination of a DC voltage having a substantially constant magnitude (shown in dashed lines) and a noise voltage such that $E_{in}$ varies with time. The noise is typically in the frequency range between 0 and 400 Hertz. Similarly, the input return signal present at input 14, designated as $E_{ret}$, is the voltage resulting from the superposition of the noise voltage on the return DC voltage (shown in dashed lines). The noise voltage superimposed on both $E_{in}$ and $E_{ret}$ has the same characteristics and is generally referred to as common mode noise voltage. The reference potential applied to the comparators 16 and 18 on line 34 is designated as $V_{ref}$ and is formed by the superposition of the noise voltage on a ramp having a constant slope (shown in dashed lines). FIG. 2B shows the signal on the output of the comparator 18; FIG. 2C shows the signal on the output of the comparator 16; and FIG. 2D shows the output pulse developed by the EXCLUSIVE OR logic circuit 24.

In operation, it is assumed that initially the counter 82 and the display 86 are reset, that switch 80 is open and that the input signals $E_{in}$ and $E_{ret}$ are applied to the terminals 12 and 14, respectively. Upon the development of a signal by the logic circuit 24 which causes switch 62 to open, the reference signal, $V_{ref}$, on output 34 begins to ramp due to the presence of a voltage difference between the inputs 50 and 52 of the integrator 48. Since the levels of the input signals on inputs 30 and 38 are greater than the reference potential in inputs 32 and 40, the outputs 36 and 42 of the comparators 16 and 18 remain in their initial state. If at any time the ramping reference signal has a level equal to or greater than the level of the input signal at the inputs of either of the comparators 16 and 18, the output of the respective comparator will be caused to change state, as illustrated in FIGS. 2B and 2C.

Because of the common mode noise voltage that is impressed on the DC levels of $E_{in}$ and $E_{ret}$ (see FIG. 2A), in prior-art digital voltmeters the times that $E_{in}$ and $E_{ret}$ are crossed by $V_{ref}$ is dependent on the magnitude of such noise and such effect is indicated by the error intervals 88 and 90 in FIG. 2. As shown, it should be recognized that a maximum error would occur if the common mode noise voltage caused $E_{in}$ to be at its maximum level when it is crossed by $V_{ref}$ and yet caused $E_{ret}$ to be at its maximum level when it is crossed by $V_{ref}$. In this situation the output pulse developed by the logic circuit 24 would have a pulse width indicated by the dashed lines 94 in FIG. 2D, and consequently would cause the counter 82 to indicate a much smaller difference in input signals than truly existed. Similarly, if the common mode noise voltage caused $E_{in}$ to be at its minimum level and $E_{ret}$ to be at its maximum level when crossed by $V_{ref}$, the pulse width would be widened and the counter 82 would indicate a much greater difference in input signals than truly existed.

In accordance with the present invention, the input signal $E_{ret}$ is also applied to the isolating amplifier 22 such that the common mode noise voltage portion of the input signal is developed on the line 70 and hence at the input 52 of the integrator 48. The isolating amplifier 22 provides a high output impedance and thus isolates the output stage of the device supplying the input voltage $E_{in}$ from any impedance variations of the integrator 48. Since there is essentially no delay in propagating $E_{in}$ through the amplifier 22, the voltage level at input 52 varies in the same manner as the common mode noise voltage received at the input terminal 14. Moreover, since the zener diode 68 conducts voltage changes on line 70, the level of the voltage applied from the current source 64 to the input 54 also includes the common mode noise voltage. Since the potential difference applied between the output 66 and the input 52 is constant, the output signal developed by the integrator 48 an output 34 is a ramp having a constant positive slope. However, since the input 52 is floating at a potential corresponding to the instantaneous level of the common mode noise voltage, the ramp is modulated an amount corresponding to the common mode noise voltage level. The application of this modulated ramp signal to the inverting terminals 32 and 40 of the comparators 16 and 18, respectively, causes the reference potential applied to the comparators to vary in a like manner as the DC levels of the input signals vary due the presence of the common mode noise voltage. Because the variation in reference potential at any point in time is substantially the same as the variation in input voltage, the time that the input signal crosses the reference potential will be the true time irrespective of the presence of common mode noise voltage.

As the modulated reference signal crosses the input signal, $E_{ref}$, the output 42 of comparator 18 goes high (see FIG. 2B). Consequently, the output of the NAND logic circuit 24 goes high, which in turn causes switch 80 to close. The closure of switch 80 connects the oscillator 78 to the counter 82, hence providing the train of pulses to the counter 82. The counter 82 serves to provide an indication of the time that elapses after the output 42 goes high and is sequentially advanced by each pulse. The display 86 provides a visual indication of the elapsed time. In a like manner, as the input signal $E_{in}$ is crossed by the reference signal, the output 36 goes high (see FIG. 2C). In turn the output developed by NAND logic circuit 24 goes low, forming an output pulse of a duration corresponding to the difference in the time occurrences of the change of state of the comparators 16 and 18 as shown in FIG. 2D. The NAND logic circuit 24 also develops a signal which causes switch 80 to open. As switch 80 opens, the oscillator 78 is disconnected from the counter 82, thereby terminating the application of pulses thereto. Hence, the counter 82 stops counting with its value indicative of the pulse width of the output pulse and representative of the true difference in the DC levels of the input signals.

When the ramp reaches its predetermined maximum value, the occurrence is sensed by a sensor (not shown) and the logic circuit 24 develops a signal which causes the switch 62 to close, thereby connecting the positive voltage source 60 to the input 50. This causes the potential at the input 50 to drop and hence the ramp voltage at output 54 to decrease at a constant rate. When the ramp voltage reaches its initial level, the logic circuit 24 develops a signal that causes the switch 62 to open, and provides a reset signal over line 87 to reset the counter 82 and the display 86. This readies the converter 10 for the next voltage measuring operation.

Referring now to FIG. 3, a second embodiment of an analog-to-digital converter of the single slop detection type made in accordance with the present invention is illustrated. The converter is generally designated by numeral 100. Many of the parts of the converter 100 are identical in construction to like parts in the converter 10 described above, and, accordingly, there has been applied to each part of the converter 100 a reference numeral in the 100 series corresponding to the reference numeral in the 10 series that was applied to the like part of the converter 10 described above.

The fundamental difference between the converter 100 of FIG. 3 and the converter described above is the inclusion of a normal mode noise voltage filter circuit 102 between the input terminals 112 and 114 and the inverting inputs 130 and 138 of the comparators 116 and 118, respectively. The filter circuit 102 includes a resistor 104 connected between the terminal 112 and the input 130, a resistor 106 connected between the terminal 114 and the input 138, and a capacitor 108. The resistors 104 and 106 serve to attenuate normal noise voltage present on the input terminals. The capacitor 108 serves to maintain the voltage across its terminals constant, thereby tending to prevent signal variations due to normal mode noise that appear at the terminals 112 and 114 from reaching the inputs 130 and 138.

In addition, a resistor 135 is connected between the output 134 and the input 132 of the comparator 116, a resistor 137 is connected between output 134 and the input 140 of the comparator 118, and a resistor 151 is connected between the line 170 and the noninverting input 152 of the integrator 148. The resistors 135, 137 and 151 are temperature compensating resistors and serve to prevent variations in current due to temperature changes from adversely effecting the operation of the converter 100. In the preferred embodiment, resistor 135 has a resistance equal to that of resistor 104, resistor 137 has a resistance equal to that of resistor 106, and resistor 151 has a resistance equal to that of resistor 158. In an alternative embodiment, the resistors 106 and 137 are removed from the circuit.

Figure 4:
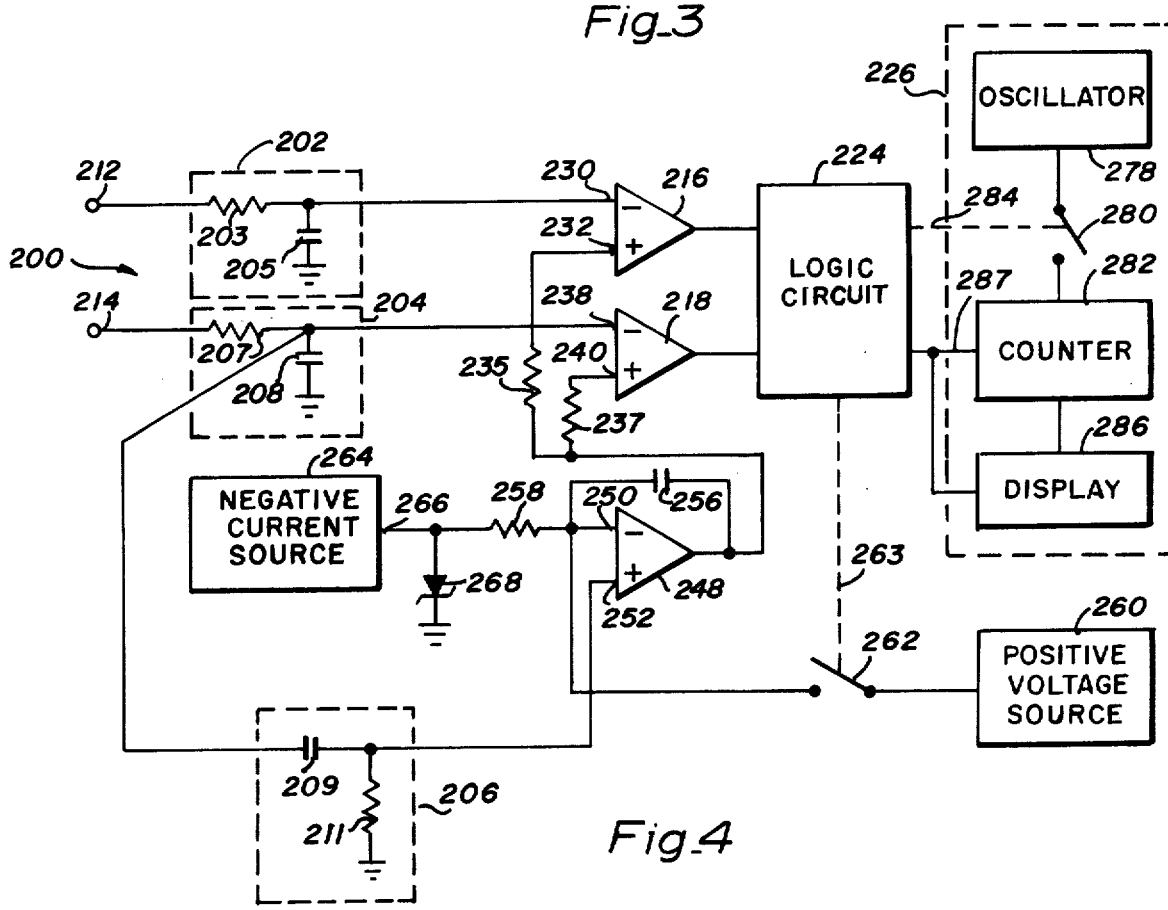

Referring now to FIG. 4, still another embodiment of an analog-to-digital converter made in accordance with the present invention is illustrated. The converter is generally designated by the numeral 200. Many of the parts of this converter 200 are identical in construction to like parts in the converter 10 described above, and accordingly, there has been applied to each part of the converter 200 a reference numeral in the 200 series corresponding to the reference numeral in the 10 series that was applied to the like part of the converter described above.

The fundamental differences between the converter 200 of FIG. 4 and the converter 10 described above is the addition of normal mode and common mode noise voltage filters 202 and 204 between the input terminals 212 and 214 and the inverting inputs 230 and 238 of the comparators 216 and 218, respectively. Furthermore, the isolating amplifier 22 has been eliminated and replaced with a differentiating circuit 206 and the cathode of the Zener diode 268 is connected to ground so that the source 264 provides a constant magnitude DC potential at the input 250.

The filter circuit 202 includes a resistor 203 having one end connected to the input terminal 212 and a capacitor 205 connected between the other end of the resistor 203 and ground. The resistor 203 serves to attenuate normal mode and common mode noise voltage and the capacitor 205 serves to maintain a constant voltage at the input 230. Similarly, the filter circuit 204 includes a resistor 207 for attenuating the magnitude of the normal mode and the common mode noise voltage and a capacitor 208 for tending to maintain a constant voltage at the input 238. Accordingly, the filter circuits 202 and 204 serve to cancel out the effect of normal and common mode noise voltage between the terminals 212 and 124.

The differentiating circuit 206 includes a capacitor 209 having one end connected to the junction of the resistor 207 and the capacitor 208, and a resistor 211 connected between the other end of the capacitor 209 and ground. The common junction of the capacitor 209 and the resistor 211 is connected to the noninverting terminal 252 of the integrator 248. The differentiating circuit 206 serves to differentiate the input signal remaining after portions of the normal mode and common mode noise voltage have been removed by the filter 204. Since such signal still contains common mode noise voltage, the differentiated signal which is developed across resistor 211 and applied to the input 252 contains the common mode noise voltage in differentiated form. Moreover, since the source 264 provides a constant potential at output 266 and since the integrator 248 serves to integrate a voltage equal to the difference in potentials applied between the output 266 and the input 252, upon integration, a modulated ramp signal is developed on the output 234. This modulated ramp signal includes a common mode noise voltage in time coincidence with the common mode noise voltage applied to the inputs 230 and 238.

In the preferred embodiment, temperature compensating resistors 235 and 237 are included between the output 234 and the inputs 232 and 240, respectively, and serve to compensate for voltage variations due to temperature changes.

It should be noted that the normal mode filter circuits 202 and 204 also serve to attenuate the common mode signal. However, when the product of the resistance of resistor 211 and the capacitance of capacitor 209 equals the product of the resistance of resistor 258 and the capacitance of capacitor 256, the level of the modulated ramp applied to the reference inputs 232 and 240 will be equal to the level of the attenuated common mode signal at inputs 230 and 238, thus cancelling the common mode error.

Figure 5:
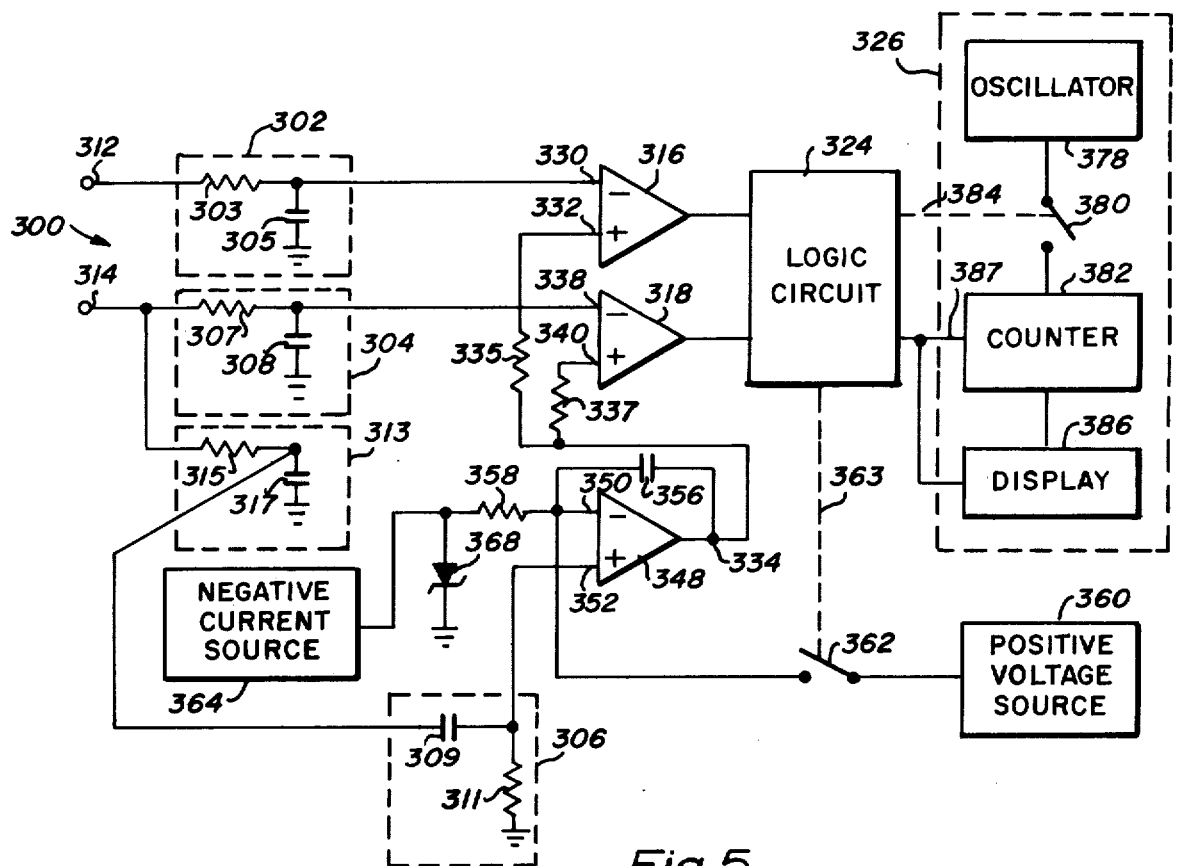

Yet another embodiment of the converter made in accordance with the present invention is illustrated in FIG. 5. The converter is generally designated by the numeral 300 and many of its parts are identical in construction to like parts of the converter 200 described above. Accordingly, there has been applied to each part of the converter 300 a reference numeral in the 300 series corresponding to the reference numeral in the 200 series that was applied to the like part of the converter 200.

The fundamental difference between the converter 300 and the converter 200 is the inclusion of an attenuating circuit 313 between the input terminal 314 and the differentiating circuit 306. The attenuating circuit 313 includes a resistor 315 having one end connected to the terminal 314 and its other end connected to an end of a capacitor 317, the other end of the capacitor 317 being connected to ground. The junction between the common end of the resistor 313 and the capacitor 317 is connected to one end of the capacitor 309. The attenuating circuit 313 includes components which are identical to those of the noise filter circuit 304 and serves to remove noise from the differentiating circuit 306. In addition, the circuit 313 isolates the integrator 348 from any impedance change that may occur in the comparator 318 during crossover.

Figure 6:
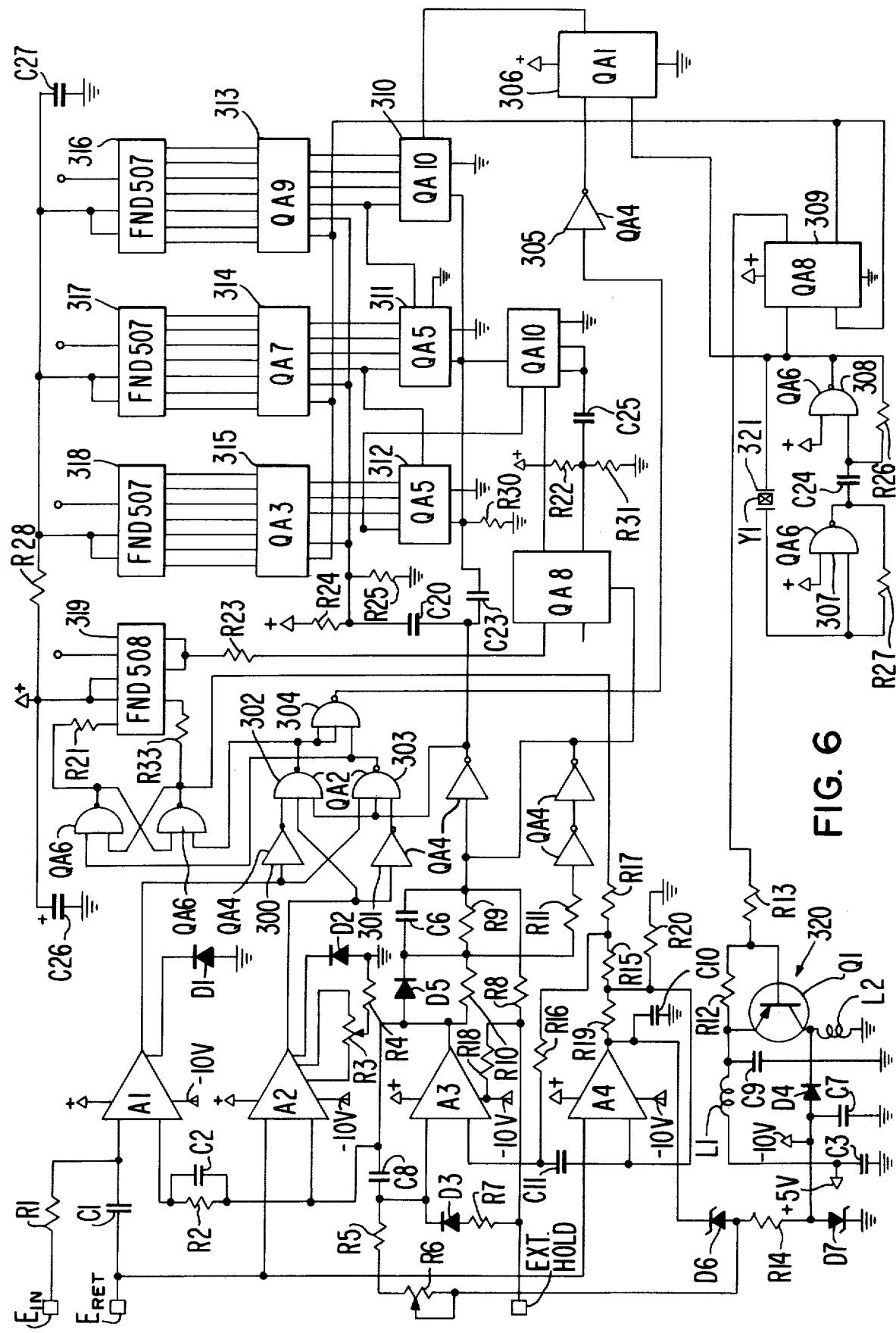
FIG. 6 is a detailed schematic diagram of one embodiment of an analog-to-digital converter in accordance with the present invention.

FIG. 6 is a detailed schematic diagram illustrating one specific embodiment of a single-slope digital voltmeter in accordance with the present invention, which is commercially available as the Fairchild Model 32 Digital Panel Meter. It will be readily appreciated that the circuit is similar in design and operation to the circuits illustrated in functional block diagrams in FIGS. 1 and 3. Thus, a detailed description is not given other than to identify the commercially available components of the circuit.

$E_{in}$ is applied as an input to operational amplifier A1 and $E_{ref}$ is applied as an input to operational amplifier A2. The outputs from A1 and A2 are applied to the composite NAND gate comprising inverters 300, 301 and triple input NAND gates, 302, 303 and 304. The output of the composite NAND gate is applied through inverter 305 to control binary counter 306. The input to counter 306 is from the composite oscillator comprising LC oscillator 320, crystal 321, NAND gates 307, 308 and flip-flop 309. The output of counter 306 is applied to the counter and display circuitry comprising counters 310, 311, 312, LED drivers 313, 314, 315, and numeric displays 316, 317, 318, 319.

The ramp generator comprises operational amplifier A3 and attendant circuitry with an output therefrom being applied as inputs to operational amplifiers A1 and A2. The isolation amplifier comprises operational amplifier A4 with an output therefrom being applied as an input to operational amplifier A3 of the ramp generator.

Component values for one embodiment are as follows:

A1 Op. Amp. LM201A
A2 Op. Amp. LM201A
A3. Op. Amp. LM307
A4 Op. Amp. LM307
C1 1μFd 100V
C2 220pFd 50V
C3 10μFd 20V
C6 0.01μFd 50 V
C7 10μFd 20V
C8 0.47μFd 50V
C9 3.3μFd 15V
C10 0.1μFd 50V
C11 0.1μFd 50V
c20 470pFd 50V
C23 470pFd 50V
C24 0.01μFd 50V
C25 470pFd 50V
C26 3.3μFd 20V
C27 3.3μFd 20V
DS10 LED FND 508
DS11 LED FND 507
DS12 LED FND 507
DS13 LED FND 507
D1 FDH600
D2 FDH600
D3 FD300
D4 FDH 600
D5 FDH600
D6 FCT 1025 Ref. Zener 6.8V
D7 1N758A Zener
L1 10μH
L2 51μH
R1 100KΩ
R2 100KS
R3 1MΩ
R4 10MΩ
R5 280KΩ
R6 50KΩ
R7 10KΩ
R8 20KΩ
R9 2.4MΩ
R10 10MΩ
R11 20KΩ
R12 300Ω
R13 510Ω
R14 20KΩ
R15 1.8KΩ
R16 270KΩ
R17 10MΩ
R18 270KΩ
R19 240Ω
R20 10KΩ
R21 300Ω
R22 10KΩ

R23 120Ω
R24 10KΩ
R25 10KΩ
R26 3KΩ
R27 3KΩ
R28 15Ω
R30 68KΩ
R31 10KΩ
R32 510Ω
R33 300Ω
QA1 4024 CMOS 7-stage Binary Counter
QA2 4023 CMOS Triple 3-input NAND Gate
QA3 9374 LED Digit Driver
QA4 4049 CMOS Hex Inverting Buffer
QA5 4518 CMOS Dual 4-bit Decade Counter
QA6 9LS00/74LS00 Quad 2-input NAND Gate
QA7 9374
QA8 9LS74/74LS74 Dual D Flip-Flop
QA9 9374
QA10 4518 CMOS
Q1 2N3906
Y1 3.579 MHz Crystal From the above, it will be seen that there has been provided analog-to-digital converters of the single-slope detection type which fulfill all of the objects set forth above.

While the invention has been particularly shown and described with reference to certain preferred embodiments, it will be understood by those skilled in the art that various alterations and modifications in form and detail may be made therein. Accordingly, it is intended that the following claims cover all such alterations and modifications as fall within the true spirit and scope of the invention.

What is claimed is:

1. An analalog-to-digital converter of the single slope detection type comprising:
    a first input terminal for receiving a first input signal formed by the superposition of a common mode noise voltage on a first DC voltage;
    a second input terminal for receiving a second input signal formed by the superposition of said common mode noise voltage on a second DC voltage;
    ramp generating means coupled to said second input terminal and receiving said second input signal; said ramp generating means operative to isolate said common mode noise voltage from said second input signal and to develop a ramp reference signal that is modulated by said common mode noise voltage;
    a first comparator having a first input connected to said first terminal for receiving said first input signal, a second input for receiving the modulated ramp reference signal and a first output, said first comparator being responsive to said first input signal and said modulated ramp reference signal and operative to produce a first output signal on said first output which changes state when the voltage level of the modulated ramp reference signal exceeds the voltage level of said first input signal;
    a second comparator having a third input connected to said second terminal for receiving said second input signal, a fourth input for receiving the modulated ramp reference signal and a second output, said second comparator being responsive to said second input signal and said modulated ramp reference signal and operative to produce a second output signal on said second output which changes state when the voltage level of the modulated ramp reference signal exceeds the voltage level of said second input signal; and
    a logic circuit coupled to said first and second outputs, said logic circuit being responsive to said first and second output signals and operative to produce a pulse having a duration that corresponds to the time difference between the changes of state of said first output signal and said second output signal, such duration being indicative of the voltage difference between said first input signal and said second input signal.

2. An analog-to-digital converter of the single slope detection type as recited in claim 1, wherein said ramp generating means includes first means for generating a generally constant voltage; integrating means responsive to said constant voltage and said common mode noise voltage and operative to develop said modulated ramp reference signal; and second means coupled to said second input terminal for isolating said common mode noise voltage from said second input signal.

3. An analog-to-digital converter of the single slope detection type as recited in claim 2 wherein the first and second input signals further include normal mode noise voltages and further comprising second filter circuit means coupled between said first and second input terminals and said first inputs for attenuating said normal mode noise voltages.

4. An analog-to-digital converter of the single slope detection type as recited in claim 2 wherein said second means includes a first operational amplifier for isolating said second input terminal from impedance variations of said integrating means.

5. An analog-to-digital converter of the single slope detection type as recited in claim 4 wherein said integrating means includes a second operational amplifier arranged in an integrator configuration and having a fifth input connected to said first means, a sixth input connected to the output of said first operational amplifier, and a third output connected to said second and fourth inputs, and further comprising third means coupled between the outputs of said first operational amplifier and said first means for conducting the common mode noise voltage to said fifth input such that a constant potential difference is applied between said fifth and sixth inputs.

6. An analog-to-digital converter of the single slope detection type as recited in claim 5 wherein said third means comprises a Zener diode which breaks down when a predetermined voltage is applied at its anode by said first means.

7. An analog-to-digital converter of the single slope detection type as recited in claim 2 wherein said second means includes a differentiating circuit coupled between said second input terminal and said sixth input for differentiating said second input signal.

8. An analog-to-digital converter of the single slope detection type as recited in claim 7 wherein said first and second input signals further include normal mode noise voltage and further comprising fourth filter circuit means coupled between said first input terminal and said first input for attenuating normal mode noise voltage and fifth filter circuit means coupled between said second input terminal and said third input for attenuating normal mode noise voltage.

9. An analog-to-digital converter of the single slope detection type as recited in claim 2 wherein the first and second input signals further include normal mode noise voltage, and further comprising fourth filter circuit means coupled between said first input terminal and said first input for attenuating common mode and normal mode noise voltage and fifth filter circuit means coupled between said second input terminal and said third input for attenuating common mode and normal mode noise voltage, said second means including sixth filter circuit means coupled to said second input terminal for attenuating common mode and normal mode noise voltage and for isolating said integrating means from any impedance variations present in said second comparator during crossover and seventh means coupled between said sixth means and said integrating means for differentiating the attenuated signal at the output of said sixth means.

10. An analog-to-digital converter of the single slope detection type as recited in claim 9 wherein said integrating means include a second operational amplifier arranged in an integrator configuration and having a fifth input connected to the output of said first means for receiving said constant voltage, a sixth input connected to the output of said seventh means for receiving the differentiated signal and a third output connected to said second and fourth inputs.

* * * * *